May 26, 1970 W. L. LEYDE 3,514,713

VARIABLE FREQUENCY SIGNAL GENERATOR WITH DIGITAL AUTOMATIC FREQUENCY STABILIZATION

Filed Oct. 18, 1968 3 Sheets-Sheet 1

INVENTOR
WARREN L. LEYDE
BY Christensen, Sanborn, & Matthews
ATTORNEYS

May 26, 1970 W. L. LEYDE 3,514,713

VARIABLE FREQUENCY SIGNAL GENERATOR WITH DIGITAL AUTOMATIC FREQUENCY STABILIZATION

Filed Oct. 18, 1968 3 Sheets-Sheet 2

May 26, 1970 W. L. LEYDE 3,514,713

VARIABLE FREQUENCY SIGNAL GENERATOR WITH DIGITAL AUTOMATIC FREQUENCY STABILIZATION

Filed Oct. 18, 1968 3 Sheets-Sheet 3

INVENTOR
WARREN L. LEYDE

BY Christensen, Sanborn & Matthews

ATTORNEYS

United States Patent Office 3,514,713

Patented May 26, 1970

3,514,713

VARIABLE FREQUENCY SIGNAL GENERATOR WITH DIGITAL AUTOMATIC FREQUENCY STABILIZATION

Warren L. Leyde, Seattle, Wash., assignor to Pacific Technology, Inc., Seattle, Wash., a corporation of Washington Filed Oct. 18, 1968, Ser. No. 768,847
Int. Cl. H03b 3/04
U.S. Cl. 331—14 10 Claims

ABSTRACT OF THE DISCLOSURE

Output signals from an accurate fixed frequency signal source are used to define an accurate time interval for counting output signals from a variable frequency oscillator (VFO). A counter control circuit associated with the timing signal generator and a VFO counter control circuit determine whether the number of signals from the VFO during the set time interval is too high or too low for the selected setting of the frequency selection switches. A logic control network then serves to adjust the parameters of the VFO so that the output frequency thereof is either increased or decreased. The duration for counting output signals from the VFO during each updating cycle as well as the division factor associated with the lowest order counting unit in the counter associated with the VFO are adjusted in response to adjustment of the highest order selection switch in the frequency selection portion of the system so that the dialing resolution and accuracy of the overall system remain essentially constant throughout the entire range of system operation.

Accurate frequency synthesizers operating on the basis are harmonically related to the frequency of a reference of generating output signals of a selected frequency which crystal oscillator are presently available. While such synthesizers operate to provide highly accurate selected frequencies the cost of such equipment is high. Various types of variable frequency signal generators have been devised for providing signals of a selected frequency without going to the expense associated with a synthesizer system. Typically such lower cost systems utilize a variable frequency oscillator having a feedback loop of some sort associated therewith for adjusting the output frequency of the oscillator in accordance with the setting of a set of decade selection switches. To date such arrangements have suffered the drawback of not having a constant dialing resolution throughout the operating range of the system and also the accuracy of the frequency of the signal being generated has left room for improvement.

It is therefore an object of the present invention to provide a variable frequency signal generator making use of a variable frequency oscillator.

Another object of the present invention is to provide a variable frequency oscillator connected in a feedback circuit arrangement such that the frequency of the output signals is rapidly adjusted to the desired frequency as established by a set of decade switches.

Another object of the present invention is to provide a variable frequency signal generator using a variable frequency oscillator wherein the dialing resolution and accuracy of the system remains essentially constant throughout the entire range of operation.

Another object of the present invention is to provide a precision variable frequency signal generator having the capability of overcoming zero drift problems and utilizing circuit arrangements such that the resultant equipment can be manufactured at a cost substantially below the cost of other signal generators which provide a degree of accuracy corresponding to that of the system of the present invention.

An additional object of the present invention is to provide a variable frequency signal generator having improved output circuitry for providing different wave shapes at power levels above that normally associated with simple variable frequency sources.

The above as well as additional advantages and objects of the invention are achieved through the use of a system wherein first and second counters are respectively coupled with the output circuits of a variable frequency oscillator and of an accurate fixed frequency signal source such as a crystal controlled oscillator. The counter associated with the fixed frequency signal source is preset to a condition such that it provides an output signal after a predetermined number of pulses have been received from the associated signal source. Thus an accurate time signal generator is provided. The counter associated with the variable frequency oscillator (VFO) is coupled with a set of coincidence detection circuits which are in turn controlled by settable frequency selection switches. The output circuitry of the coincidence detectors and the output circuitry from the first counter are coupled to counter control circuits such as flip-flops which in turn control the frequency adjusting circuitry of the VFO. The arrangement is such that the VFO is adjusted to provide an output signal of increased or decreased frequency depending upon whether the number of counts received by the VFO counter during the fixed time interval is below or above the count required for the frequency of the VFO output signals to satisfy the settings on the frequency selection switches.

The highest order selection switch is coupled to the lowest order selection switch in a manner such that the signals received from the VFO effectively undergo division by a factor other than ten when the highest order selection switch is in predetermined settings. Simultaneously the counter associated with the fixed frequency signal source is adjusted in response to settings of the highest order decade switch so that the counting interval is automatically adjusted. Thus the system operates to provide the selected frequency with an accuracy which remains essentially constant throughout the dialing range. The VFO control circuit disclosed with reference to the preferred embodiment includes not only a nonlinear control circuit for maintaining a substantially constant percentage correction factor at different frequency levels but also includes an additional rate circuit to achieve increased system stability by avoiding error signals which in the prior art have tended to cause the frequency of the oscillator to drift to one side or the other of the desired frequency.

The invention will be more clearly understood from the following description when read with reference to the accompanying drawings wherein, FIG. 1 is a block diagram illustrating the general operating characteristics of the preferred embodiment of the invention.

Figure 1:
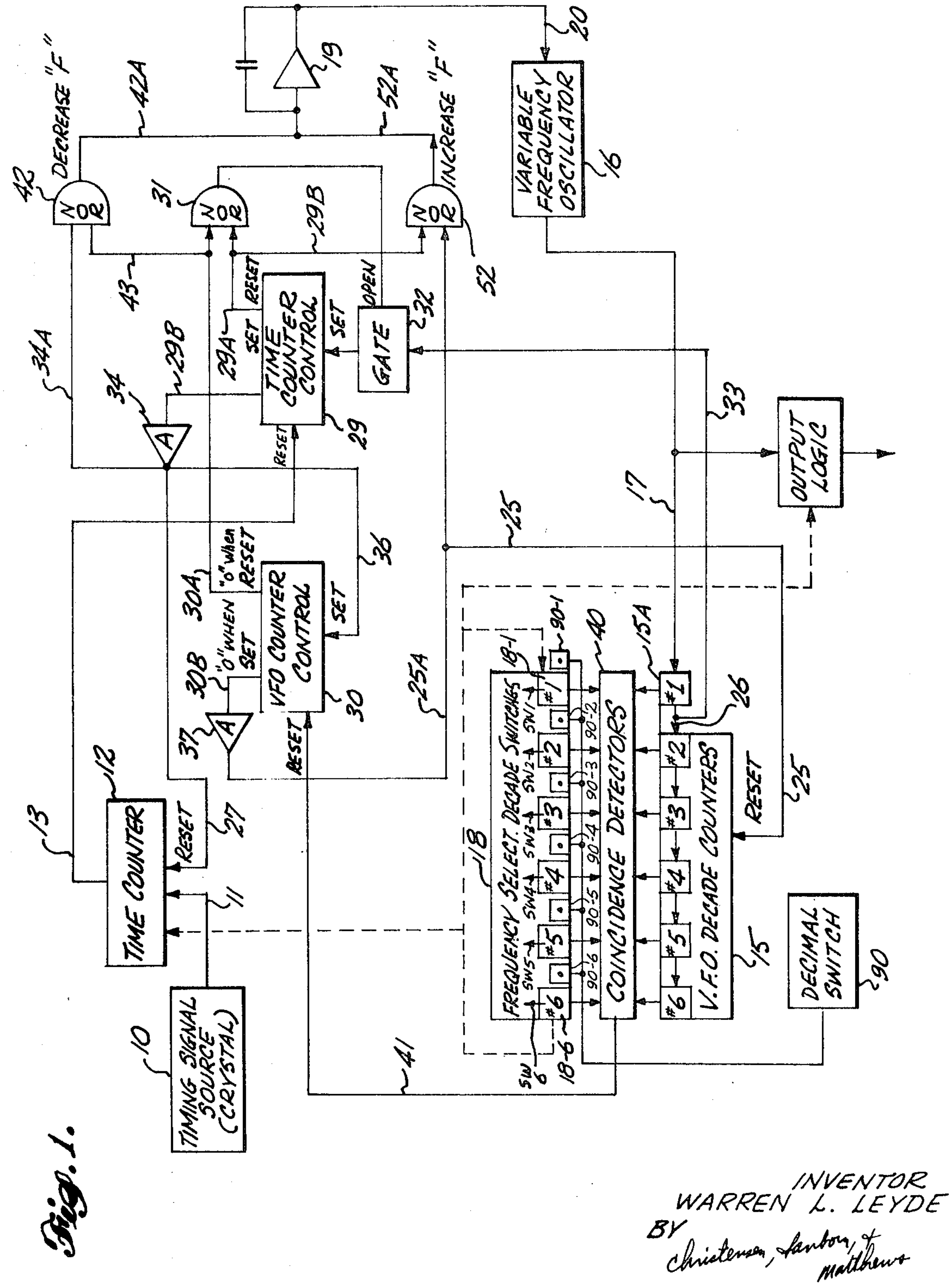

Turning now to the drawings, and in particular to FIG. 1, the general operation of the system will be described. Output signals from a timing source such as 10 are applied via the lead 11 to a time pulse counter 12 which serves to provide an output signal on its lead 13 after a predetermined number of counts or timing signals have been received from the source 10. The counter 12 thus serves to provide an accurate time reference, typically in the order of 0.25 to 0.20 seconds as described in detail hereinafter.

Simultaneous with the removal of the reset signal on the time counter 12 which permits the starting of that counter from zero, a second counter 15 referred to as a variable frequency oscillator decade counter starts counting the output signals applied thereto from the variable frequency oscillator 16 via its output circuit 17. The two counters then continue counting the actual time pulses and the output signals from the oscillator 16, respectively, until the count in the counter 15 corresponds to that pre-established in the adjustable frequency selection decade switches 18 and until the time counter 12 reaches its predetermined count corresponding to a known time interval. If the time counter 12 reaches its predetermined count first, then the integrator 19 coupled with the input circuit 20 of the VFO 16 serves to apply a correction voltage to the VFO of the proper polarity and magnitude to cause the output frequency of the VFO to increase. If the counter 15 reaches a count determined by the setting of the decade switches 18 before the time counter 12 reaches the end of its counting period, then the integrator 19 applies a correction signal to the VFO 16 of an opposite polarity and of sufficient magnitude to reduce the frequency of the VFO. The correction voltage is applied for a time corresponding to the time between one counter reaching its capacity and the other counter reaching its capacity. The time interval established by the counter 12 is so related to the decade switches 18 and counter 15 that the frequency of the oscillator 16 is rapidly adjusted to cause the output signal thereof to be at a frequency corresponding to the frequency setting on the switches 18.

The manner in which the counters, integrator and VFO are controlled is as follows. The starting time is taken at a point in the system cycle when the input control circuit 25 for the VFO decade counters 15 is maintaining a "reset" signal on the counters so that the five highest decades thereof remain at zero. The lowest order decade 15A does not have the reset signal applied thereto and accordingly it continuously receives signals from the VFO 16 and hence repeatedly applies transfer signals via its output circuit 26 to the second order in the decade counter. As described hereinafter, the lowest order counting section 18–1 divides the input signal by ten, five, or two depending on the setting of the highest order counter 18–6. The time counter 12 initially stands at zero even though the timing signal source 10 is applying counting signals thereto via circuit 11 since the control circuit 27 is maintaining a "reset" signal on the time counter 12. These conditions correspond to the time when the VFO counter control 30 is in a "reset" condition and the time counter control 29 is in a "reset" condition.

With both counter controls 29 and 30 in their reset conditions their output circuits 29A and 30A will serve to open the NOR gate 31 so that the control gate 32 for the time counter control 29 will be open. Therefore, when the units order of the decade counter 15 reaches capacity and returns to a zero condition, a signal will be applied via circuit 33 and gate 32 to the time counter control 29 causing it to change from its reset to its set condition. Thus its output circuit 29B causes the buffer amplifier 34 to remove the reset signal from the control circuit 27 of the time counter 12 so that the time counter starts counting signals from the source 10. Simultaneously the buffer amplifier 34 applies a signal via lead 36 to the counter control 30 causing it to change to its "set" condition and thereby cause its output circuit 30B to remove the reset signal from lead 25 by means of the buffer amplifier 37. Therefore at this time the decade counter 15 starts counting signals being applied thereto from the VFO 16. It will be seen at this time that both counter controls are in their "set" conditions, and thus the gate 32 at the input of the control 29 will be closed. Accordingly, even though the units order of the counter 15 repeatedly provides a count signal to the tens order counter 18–2, the signal on line 33 will have no effect on the time counter control 29.

The two counters continue counting until one or the reaches its predetermined capacity before any change is made in the output of the VFO 16. Assuming the time counter 12 reaches its pre-established count before the decade counter 15 reaches a count determined by the setting of the frequency selection switches 18, it will be seen that a signal will be provided on the output circuit 13 from the counter 12 to the "reset" input of the time counter control 29 before the coincidence detector 40 applies a signal via its output circuit 41 to the "reset" input of the VFO counter control 30. When this occurs the counter control 29 will reset causing the buffer amplifier 34 to maintain a reset signal on the time counter 12. An "open" signal is also applied via lead 29A to the "NOR" gate 52 having a second input circuit connected by buffer 37 to the set output circuit 30B of the VFO counter control 30. The gate 52 operates in a manner such that an increase frequency signal is applied on its output circuit 52A if the VFO counter control is in a set condition and the time counter control 29 is in a reset condition. Since these conditions exist if the time counter 12 reaches its threshold before the decade counter 15 reaches its threshold it will be seen that an increase frequency signal will be applied via the inverting and integrating amplifier 19 to the VFO 16 to cause the frequency of the oscillator 16 to increase.

When the decade counter 15 does reach coincidence with the setting of the frequency select switches 18, the counter control 30 will be "reset" and thus the NOR gate 52 will close causing the frequency of the oscillator 16 to remain at whatever frequency it is then providing. When the counter control 30 goes to its reset condition, the buffer amplifier 37 again applies a reset signal via circuit 25A and 25 to the decade counter 15. Simultaneously the NOR gate 31 will open gate 32 so that when the units order of the decade counter 15 next applies a transfer signal on its output circuit 26, the above operation will be repeated. Thus the VFO is effectively locked to the selected frequency.

If the decade counter 15 reaches coincidence with the setting of the selection switches 18 before the time counter 12 reaches the end of its time counting period, the VFO counter control 30 will be reset before the time counter control 29 is reset. When this occurs it will be seen that since the VFO counter control 30 is changed to its "reset" condition and the time counter control 29 is still in its set condition, the second NOR gate 42 will be opened. Thus a decrease frequency signal is applied via its output circuit 42A to the integrator 19. Under these conditions the setting of the integrator 19 will be adjusted such that the output frequency of the oscillator 16 will be decreased. When the time counter 12 then reaches its capacity, the time counter control 29 will be reset causing gate 42 to close, time counter 12 to be provided with a reset signal, and gate 31 opened so that a further updating cycle begins immediately.

From thse above it will be seen that the duration of the increase frequency or decrease frequency signals applied to the integrator 19 will be proportional to the time difference for the counters 15 and 12 to reach their set capacities. Thus the system operates to rapidly "zero in" on the pre-established frequency as set on the frequency select decade switches 18.

As seen hereinafter, VFO updating is achieved via a charge introduced into the integrating capacitor of the integrator 19 of sufficient magnitude to cause the VFO frequency to change by an amount equal to the measured error. Thus a sample data system is provided which has nearly 100% correction per trial. In practice it is found that if the correction can be kept between 90% and 100% excellent operation is obtained. It will be seen that when a new frequency is dialed on the switches 18 the loop automatically corrects itself in a series of successive approximations.

As described in detail with reference to FIG. 2, when the setting of the most significant frequency dial switch 18–6 is changed, several logic parameters are modified so that the dialing resolution and accuracy remains essentially the same throughout the entire range of operation.

In addition to the decade switches for setting the numeric value of the selected frequency, the system includes the decimal switch 90 having the decimal indicators 90–1 through 90–6 associated therewith. The decimal switch controls the location of the decimal in the output frequency as set on the dials 18–1 through 18–6, and as described below, not only establishes the division factor in the down-count chain of the output circuitry but also adjusts the output wave form circuitry in accordance with the frequency selected.

Figure 2:
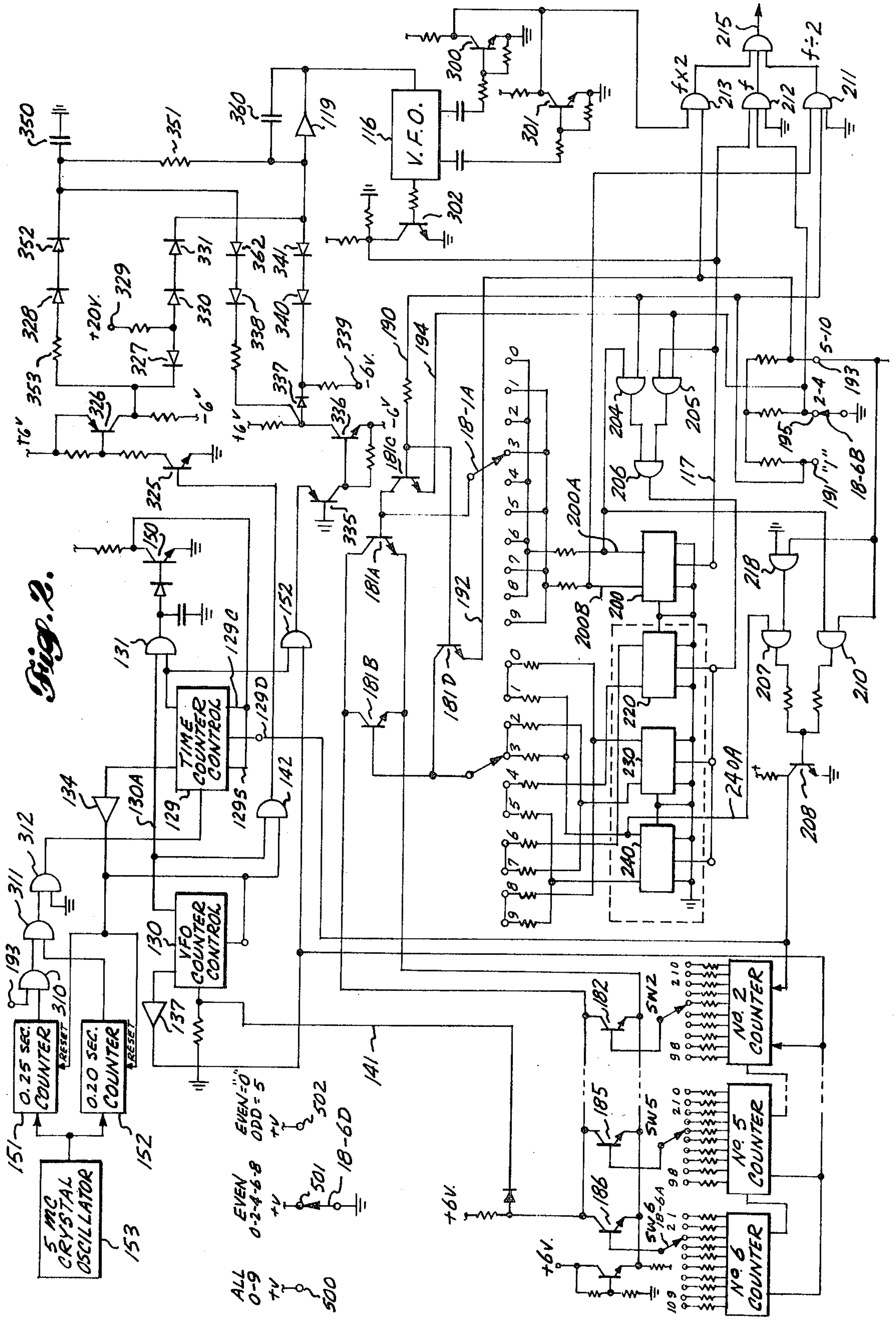
FIG. 2 is a more detailed schematic diagram of one preferred embodiment of the precision frequency generator, including details of the interconnection of the highest order decade switch with the timing circuitry and the VFO counter circuitry.

Turning now to FIG. 2 further details of one specific circuit arrangement for carrying out the teachings of the present invention will be described. Therein it will be seen that the time counter control and the VFO counter control of FIG. 1 are shown as being provided by the JK flip-flops 129 and 130. As is well known in the art, these JK flip-flops provide internal gating controls and thus the separate gate 32 of FIG. 1 is not required in the circuit arrangement of FIG. 2. In FIG. 2 the NOR gate 131 is coupled to the reset output terminals 129A and 130A of the flip-flops 129 and 130. The gate 131 in combination with the transistor 150 having its collector connected to the "clear" and "set" terminals 129C and 129S of the flip-flop 129 serves to control the time counter flip-flop 129 in the manner described in connection with the the reset signal on the line 127 which is coupled with the operation of the system of FIG. 1. Thus it will be seen that when both flip-flops 129 and 130 are in their reset conditions the flip-flops 129 will be in a condition to respond to the negative going portion of a signal on its clock terminal 129D for causing the flip-flop to go to its set condition. The buffer 134 then serves to remove the reset signal on the line 127 which is coupled with the time counters 151 and 152. For purpose of illustration the counters 151 and 152 are shown as receiving input signals from a 5 megacycle crystal oscillator 153. In practice the counters 151 and 152 can be formed using a single multi-stage binary counter chain which is selectively preset to a given count so that when the crystal oscillator has applied a required number of pulses thereto the binary counting chain will provide an output signal at a time corresponding to the selected time interval. Such time generators are per se well known in the art and thus further details are not included herein.

As described previously, the buffer 134 also serves to place the flip-flop 130 in a set condition so that the buffer 137 coupled with the set terminal of the flip-flop 130 will then remove the reset signal being applied to the VFO decaded counters. Various types of decade counters which per se are known in the art can be utilized. For purpose of illustration the system shown in FIG. 2 includes counting stages 18–2 through 18–6 which are conveniently formed using high speed synchronous binary counters. It should be noted that the highest order counting unit 18–6 has output terminals numbered as 1–10 whereas the sections 18–2 through 18–5 have the conventional numbering of 0 through 9. The purpose of this is explained hereinafter in connection with the range selection features of the present system. The units order section 18–1 also has terminals 0–9 which are selectively dialed by the two ganged switches 18–1A and 18–1B.

While various types of coincidence detection circuits can be utilized within the inventive concepts, in FIG. 2 counter stages 18–2 through 18–6 each has an NPN transistor 182–186 connected to the associated setable switch

SW2–SW6. Stages 18–3 and 18–4 are the same as the tens stage 18–2. The arrangement is such that when the count reached in all of the stages corresponds to the setting of the decade switches the associated transistors will be provided with a base signal giving rise to an output signal via line 141 to the VFO counter flip-flop 130 to cause resetting thereof.

The units order of the VFO counter differs from the higher order stages and hence is shown in greater detail in FIG. 2. It will be seen that the units order includes the JK flip-flop 200 which is connected to the output lead 117 of the variable frequency oscillator 116 so that the flip-flop 200 effectively serves to divide the VFO output by a factor of two. It will be seen that the output terminal 200A of flip-flop 200 is connected to the terminal strip 201 having even numbered values for the switching contact 18–1A of the units order switch SW1 associated therewith. Similarly the output terminal 200B of the flip-flop 200 is connected to the terminal strip 202 which has the odd numbered numerical values for the switching contact 18–1A associated therewith. It should also be noted that the output terminal 200A is coupled to the NOR gate 204 as well as to the NOR gate 210 described hereinafter. Similarly the output terminal 200B is coupled with the NOR gate 211 which is part of the output logic circuitry for the VFO.

The units order of the VFO counter includes the three additional flip-flops 220, 230, and 240 connected in a conventional circuit arrangement so that the flip-flops serve as a divide by five counter. The arrangement is such that when the VFO signals on line 117 are applied to the flip-flops 220, 230, and 240 via the NOR gates 205 and 206 directly, the output circuit 240A associated with flip-flop 240 provides signals which represents the VFO output frequency divided by 5. However when the flip-flops 220, 230, and 240 receive counting signals from the NOR gates 204 and 206 it will be seen that the flip-flop 200 is then included in the counting arrangement and hence the output signals on the line 240A correspond to the VFO output frequency divided by a factor 10. The circuit 240A serves as one of the input circuits for the NOR gate 207. The NOR gates 207 and 210 control the transistor 208 having its collector coupled to the control circuit 133 for the time counter control flip-flop 129 and also to the second stage of the VFO counter. Thus it will be seen that depending upon the control exercised over the various gates associated with the flip-flops 200, 220, 230, and 240 the output circuit provided by transistor 208 will provide signals corresponding to the VFO freqeuncy divided by a factor of 2, a factor of 5, or a factor of 10 in accordance with the logic arrangement described below. It is of importance to note that the division factors mentioned relate to a division occurring in the lowest order of the VFO counter and therefore the effect of the division is to have the count indicated by the total counter equal to some multiple of the VFO output frequency. That is, it will be recognized that for normal digital counting the units order of the counter effectively divides the input frequency by a factor of 10 in that the tens order of the counter receives a counting pulse from the units order as the units order receives each tenth pulse. However, if the transfer into the tens order occurs on every fifth pulse applied to the units order (i.e. with the units order dividing by 5) it will be seen that the net count corresponds to a factor of two times the frequency of the VFO. Similarly if the units order of the counter only divides the input frequency by 2 then the apparent count registered by the VFO counter corresponds to a factor of five times the actual frequency of the VFO. By selecting the division factor for the units order of the VFO counter and adjusting the other parameters described hereinafter in accordance with the setting of the highest order switch for the counter, the dialing resolution for the entire range of the system remains essentially constant.

It will be seen in FIG. 2 that the units order switch SW1 has contacts 18–1A and 18–1B associated therewith which move in unison. As previously described the contact 18–1A engages one or the other of the terminal strips 201 or 202. The contact 18–1B is engageable with the contact strips 189 associated with the flip-flops 220, 230, and 240 in the manner indicated. It will be seen that the output circuitry associated with the flip-flops 220, 230, and 240 has the zero and one, the two and three, the four and five, the six and seven, and the eight and nine terminals interconnected so that the switch contact 18–1B always engages a pair of the output terminals in the terminal strip arrangement 29. The switch contact 18–1B is connected to the base of transistor 181B and the contact 18–1A is connected to the base of transistor 181A for operation in the manner previously described with respect to each of the other stages of the VFO counter for purposes of serving as setable coincidence detectors. However, transistor 181B will be seen to be under the control of transistor 181D and transistor 181A is under the control of transistor 181C. The base of transistor 181C is connected by lead 190 to terminal 191 associated with the switch contact 18–6B which is ganged with the highest order setable switch 18–6A. The switch 18–6B engages the contact 191 only when the highest order decade switch is in its "one" position.

The emitter of transistor 181D is connected by lead 192 to the contact 193 associated with switch 18–6B. When the switch 18–6B is in a position corresponding to settings of five through ten for the highest order of the VFO counter the switch contact 18–6B engages contact 193. The emitter of transistor 181C is similarly connected by lead 194 to the terminal 195 which becomes engaged with contact 18–6B when the highest order switch is in its positions of two through four. It will be seen that the leads 190, 192 and 194 associated with the transistors 181C and 181D are also coupled with the output NOR gates 211, 212 and 213 associated with the VFO output circuit 215 which goes to the signal shaping and output counting circuitry of FIG. 3.

The basic frequency of the VFO is effectively doubled by the transistors 300 and 301 connected to the VFO. Therefore when gate 213 is open the output frequency on lead 215 for the signal shaping and output circuit of FIG. 3, corresponds to two times the operating frequency of the VFO. Gate 212 is directly coupled with the transistor 302 which is connected to the VFO output and thus when gate 212 is open the output circuit 215 has the basic frequency of the VFO applied thereto. Gate 211 is coupled with the flip-flop 200 and therefore when gate 211 is opened the output circuit 215 has the VFO frequency divided by two applied thereto. It will be seen that the setting of the switch contact 18–6B also controls the gates 211, 212 and 213 so that the output frequency of the VFO is controlled in accordance with the setting of the highest order switch in the VFO setable counter.

Referring again to the contacts associated with switch 18–6B it will be seen that the contact 191 corresponding to a setting of "one" is connected to the NOR gate 204 so that NOR gate 204 can pass signals from flip-flop 200 only when the highest order decade switch is in its one position. Similarly contact 195 is connected to the NOR gate 205 so that gate 205 is opened only when the switch 18–6B is in a setting corresponding to numerical values of two-four (inclusive) for the highest order decade switch. It will be seen that gates 204 and 205 both remain closed when the highest order decade switch is in its numerical settings of five-ten and thus during such settings the divide by two flip-flop 200 serves to provide output signals directly through the gate 210 (which is opened only when the highest order decade switch is in its five-ten positions) to the transistor 208 for the generation of units order transfer signals in the manner previously described. It will be seen that a NOR gate 218 is also coupled to the terminal 193 associated with the five-ten positions for switch 18–6B so that NOR gate 207 which is under the control of gate 218 will be opened only when the highest order decade switch is in its one-four settings.

From the above it will be seen that when the highest order decade switch is in a position of five-ten the units order of the VFO counter provides an output transfer signal to the adjacent counter stage upon the receipt of every other output signal from the VFO (i.e. the VFO frequency is divided by two giving the counter an apparent count of five times the VFO frequency). When the highest order decade switch is in its positions of two-four the gate 205 is opened so that the VFO signals are applied to the flip-flops 220, 230 and 240 which act as the divide by five circuit with gate 207 then providing the units order transfer signals to the adjacent highest order counting stage. Under these conditions the apparent count in the higher orders of the counter corresponds to twice the frequency of the VFO. When the highest order decade switch is in its one position the gate 204 is opened so that flip-flops 200, 220, 230 and 240 are connected in tandem giving rise to a divide by ten function with output signals being gated by gate 207 for the transfer operation.

It will be seen that the terminal point 193 associated with the settings of five-ten for the switch 18–6B is also connected as one of the control inputs for the NOR gate 310 associated with the 0.25 second counter 151. Gate 310 is connected with the NOR gate 311 which in turn is connected for control of the NOR gate 312. It will be seen that the gate 310 is opened only when the counter 151 reaches a count corresponding to 0.25 second and the highest order decade switch is in a five-ten position. Under these conditions the counting time will be 0.25 second. In other settings of the highest order decade switch the gate 310 will remain closed and hence when the 0.20 second counter 152 reaches the indicated time count the gate 311 will open causing a signal to be applied via gate 312 to the time counter control for system operation in the manner previously described.

The various logic arrangements described above give rise to the following characteristics of the system when the basic VFO frequency is between 400 kc. and 1 megacycle:

| Range of SW display | 1st stage divide | Counts/ period | F OSC nominal | VFO division | Counting period, (sec.) |
|---|---|---|---|---|---|
| 1099995<br>999995<br>500000 | ÷2 | 200K<br>100K | 1 mc<br>500 kc | ×2 | .2 |
| 499998<br>200000 | ÷5 | 250K<br>100K | 1 mc<br>400 kc | ÷1 | .25 |
| 199999<br>100000 | ÷10 | 200K<br>100K | 800 kc<br>400 kc | ÷2 | .25 |

It will be seen in FIG. 2 that the gate 142 which is opened for purposes of decreasing the VFO frequency is coupled with the base of transistor 325 which is in turn coupled with transistor 326 for controlling the diodes 327 associated with the plus 20 volt input terminal 329. This circuit operates to provide increased current to the integrator 119 via diodes 330 and 331 when transistors 325 and 326 become conductive due to the opening of gate 142. Similarly gate 152 associated with the increase frequency function is coupled with the transistors 335 and 336 for control of the diode 337. When transistors 335 and 6 become conductive the negative 6 volts applied to terminal 339 causes negative current to be applied via diodes 340 and 341 to the integrator 119 which inverts the signal for increasing the VFO frequency.

In addition to the above described control circuit for adjusting the current applied to the integrator 119 for control of the VFO frequency, it will be seen that the system includes a rate control circuit comprising in addition to the charging diodes the capacitor 350 and resistor 351 which are connected in series circuit between signal ground and the input to the integrator 119. The capacitor 350 is also connected via diodes 352 and 328 and resistor 353 to the collector of transistor 326 via diodes 362 and 38 and resistor 54 to the collector of transistor 336. This additional rate circuit serves to compensate for leakage currents associated with the integrator 119. The rate circuit senses small tracking errors of fixed polarity and builds up a voltage as a result of consecutive errors of one polarity. This in turn feeds a constant offsetting current through the resistor 351 to the integrator to thereby offset small leakage currents or other effects which tend to pull the system from its desired operating frequency. It has been found in practice that this not only reduces the amount of average error in the system but also greatly reduces the "pumping" effect as the loop tries to correct for a fixed drift. Due to dielectric absorption the main integrating capacitor 360 might have a tendency to exhibit a large internal time constant following a large change in voltage applied thereto. The rate circuit also corrects for system drift related to such dielectric absorption in capacitor 360.

Figure 3:
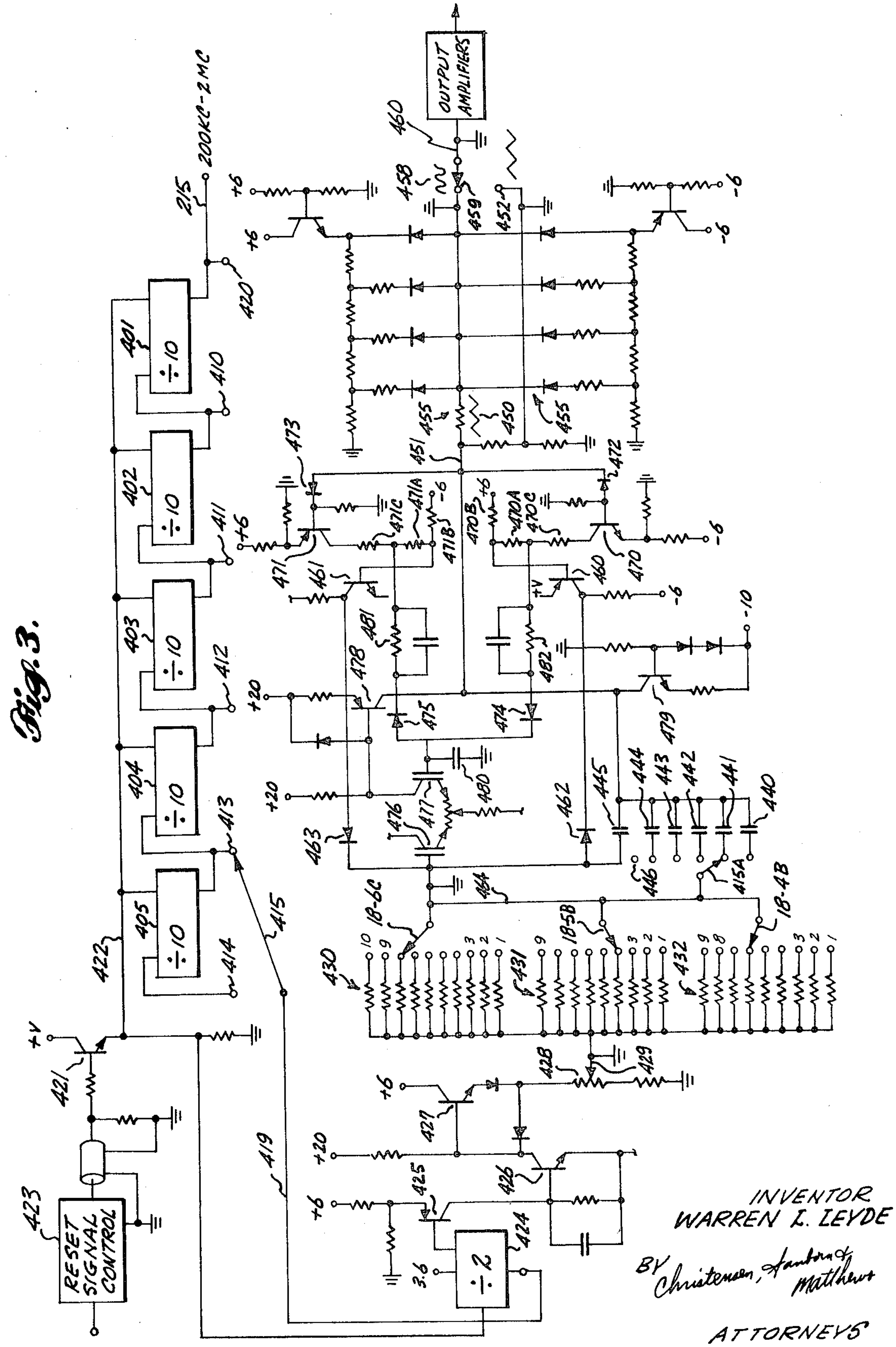
FIG. 3 is a schematic circuit diagram of the signal countdown and signal shaping circuitry associated with the output circuit of the variable frequency oscillator.

The signal countdown and signal shaping circuitry for the system is shown in FIG. 3. As previously described, the output circuit 215 from the closed loop arrangement of FIG. 2 is provided with signals in the range of 20° kHz. to 2.2 mHz. which are generated in the master frequency loop. It will be seen that the frequency doubling circiut at the output of the VFO gives rise to the indicated frequencies when the specific VFO above described is utilized. The signal countdown chain consists essentially of the decade dividers 401–405 in the specific system shown. The frequency can be divided down to any desired level with a square wave at twice the desired final frequency being provided. It is advantageous to keep the frequency at twice the ultimate desired frequency to achieve better symmetry in the final output signal.

The decimal switch contact 415 corresponding to the contact member of decimal switch 90 in FIG. 1 will be seen to be selectively engaged with one of the terminals 410–414 associated with the decimal dividers to provide square wave signals on lead 419 at the frequencies indicated adjacent the contacts 410–414. The contact 420 connected directly to the input lead 215 for the circuitry of FIG. 3 (i.e. the output circuit of FIG. 2) provides signals in the highest range, which corresponds to the decimal being located to the right of the units order decade 18–1. A reset control transistor 421 having an output circuit 422 coupled with the various decade dividers and with the flip-flop 424 serves to selectively enable external reset via the switch 423. The reset signal can be maintained for an indefinite period or momentarily with the arrangement being made such that when the switch is released the signal countdown will start at essentially zero. This causes the output signal to have a fixed phase relationship of plus or minus one cycle with respect to the signal coming from the master frequency loop of FIG. 2.

The circuitry of FIG. 3 includes the signal shaping circuits having the function of taking the basic square wave from the countdown chain on line 419 and converting the same into triangular and sine wave outputs of controlled amplitude and distortion characteristics for driving external loads. The signal from the countdown chain on line 419 is divided by the flip-flop 424 located at the input of the signal shaping circuitry. The flip-flop 424 drives the inverters 425 and 426 as well as the emitter follower 427 whose output is connected through the potentiometer 428 to signal ground. Lead 429 on the potentiometer 428 is thus provided with a square wave which typically is in the order of plus or minus 5.3 volts having good symmetry and used as the input circuit to the remainder of the signal shaping circuitry of FIG. 3.

The square wave signal on potentiometer 428 is applied to the banks of series charging resistors 430, 431, and 432 respectively associated with the switch contacts 18–6C, 18–5B, and 18–4B. These switch contacts are part of the switches SW6, SW5, and SW4 in the decade counter section and are moved in accordance with the associated decade setting. It should be noted that the bank of resistors 430 includes a resistor associated with switch contacts 1 through 10 for the highest order decade switch whereas the resistor banks 431 and 432 each include nine resistors having one resistor assoicated with each switch position for the fourth and fifth decades other than the zero positions thereof. The banks of resistors are connected to the line 464 coupled with the balanced pair of field effect transistors 476 and 477 which drive the inverter transistor 478. The collector of transistor 478 provides the triangular output wave form at circuit point 451, the collector of transistor 478 being supplied with operating potential via the transistor 479 connected in circuit as a constant current source.

The output signal at point 451 is coupled back to the lead 464 (the summing junction at the output of the charging resistors) via a selected one of the indicated charging capacitors 440, 441, 442, 443, or 444 and the capacitor 445. The value of these capacitors is selected by the decimal switch contact 15A with the specific values between adjacent capacitors differing by a factor of 10. The arrangement is such that as the frequency is decreased by decades the capacitance is increased accordingly. In one specific system capacitor 440 was 4.7 microfarads, capacitor 441 was 0.7 microfarads etc. When the decimal switch contact 415 is engaged with the contact 420, corresponding to the highest frequency range, it is seen that contact 415A engages the inactive contact 446 so that only capacitor 445 is in the circuit. The operation of the circuit is such that a square wave input to the charging resistors is integrated to cause a triangular wave to appear at the output 451 of the operational amplifier loop. The charging resistors are connected in the manner indicated to the three most significant digit switches of the main frequency control dials so that the total charging current is directly proportional to the frequency set on these dials. The charging capacitor is selected by the decimal switch such that as the frequency is decreased by decades the capacitor is increased. Thus the output triangular wave is of constant amplitude.

An important factor to be observed in connection with FIG. 3 is that the signal shaping circuitry is not generating frequencies independently but instead is receiving a signal of predetermined frequency whose characteristics it must match or be controlled by. One of the problems encountered in this art is that associated with reinsertion of the DC level to keep the triangular waves symmetrical about the zero reference axis. In the circuitry of FIG. 3 this is accomplished by the action of two separate feedback circuits. Since the triangular wave is not in a controlled relationship with respect to the phase of the incoming square wave when a frequency change is made or some other transient occurs, the circuit shown in FIG. 3 establishes an initial condition permitting a controlled phase relationship between the input and output signals. To establish an initial condition for this purpose, for example when the triangle reaches a positive maximum, the transistor 471 having its base connected via diode 473 to the output point 451 will be cut off allowing its collector to go negative. As a result the junction between the collector resistors 471A and 471B goes negative cutting off the inverter transistor 461 to thereby clamp the input field effect transistor 476 so that the triangular wave does not increase in a positive direction past that point. A similar circuit provided by transistor 470 having its base coupled by diode 472 to the output circuit 451 causes field effect transistor 476 to be cut off if the output wave form goes too far negative. The junction point between collector resistors 470A and 470B is thus connected to the base of the inverting transistor 460 which has its collector connected through diode 462 to the base of the field effect transistor 476. Thus negative current is applied to the input of the field effect transistor 476 causing the triangle to be clamped at that negative value. The triangular signal 450 will then remain at the clamped positive or negative value until the next polarity reversal of the square wave, at which time the triangle will reverse direction and initial conditions will be established.

It will be seen that the junction point between the collector resistors 471A and 471C for transistor 471 is connected via diode 475 to the capacitor 480 which is connected to the base of the field effect transistor 477. In a similar manner the junction between collector resistors 470A and 470C of transistor 470 is connected via diode 474 to the capacitor 480. The arrangement is such that the peak of the triangular signal at the output point 451 in either direction will cause the voltage comparators on both positive and negative peaks to become active and cause a small charge to be passed through the 1 megohm resistors 481 and 482 to the storage capacitor 480 (which typically is in the order of 0.47 microfarads). It is found that after several cycles of the triangular wave these loops tend to establish themselves for equal conduction on top and bottom portions of the wave form to thereby effectively insert a DC reference level into the triangular wave via the bias provided by capacitor 480.

Once a precision triangle has been generated with a known DC reference level the simple diode loading circuit 455 is used to convert the triangular wave into a sine wave of relatively low distortion. For purpose of illustration the diode loading circuit is shown as including a four-level shaping circuit with the resultant sine wave being passed to the output terminal 459. The triangle wave is applied to output terminal 452 with the selection switch 460 being selectively engaged with one or the other of the contacts 452 or 459 for the application of output signals to the output amplifier 461.

Due to the adjustments made on the lowest order of the counter associated with the VFO when the highest order switch is placed in certain ranges, with the duration of the counting time being simultaneously controlled, the system achieves essentially constant dialing resolution and accuracy throughout the operating range. Through the use of a decade control switch in the highest order which has positions of one through ten (but no zero position) the operator is forced to always use the highest order decade switch and the decimal switch in selecting a desired frequency. It should be noted that the switch arrangement in the units order is such that when the highest order decade switch is in its "one" position the units order decade switch contacts 18–1A and 18–1B are both active but are so inter-related that positions 0–9 are all effective. When the highest order switch is set to values of 2–4 the switch contact 18–1A is effectively removed from the system so that switch 18–1B determines coincidence. It will be seen that adjacent pairs of fixed contacts associated with movable contact 18–1B are interconnected. Thus only even numbered settings for the units order are effective for changing the units order for frequencies of 200 kHz. to 499.998 kHz. When the highest order switch is in positions 5 through 10 switch contact 18–1B is effectively removed from the system and contact 18–1A controls the units order coincidence setting. Since for settings of 5–10 in the highest order the units order divides the input frequency by two only, it is seen that all even number settings in the units order correspond to zero and all odd number settings correspond to five in terms of the resolution of the lowest order. As a reminder to the user of the relationship of these settings the instrument is labelled on its front panel as shown in FIG. 2 near the indicators 500, 501, 502. These indicators are associated with the units order switch and are controlled by the movable contact 18–6D (FIG. 2) of the highest order switch SW6.

There has been disclosed an accurate variable frequency signal generator which makes use of a variable frequency oscillator connected in a feedback loop error correcting system. The system as disclosed includes an advantageous output circuit arrangement which provides a stabilized triangular wave form having an accurate reference level and also a diode shaping arrangement operating on the triangular wave to provide a sine wave output.

What is claimed is:

1. A variable frequency signal generator comprising in combination: A variable frequency oscillator; a first multiple stage signal counter coupled with the output of said oscillator; frequency selection means including a plurality of settable members having co-incidence detection means controlled thereby and coupled with said counter for providing a first signal when said counter reaches a given count; timing signal means adapted to periodically provide a timing signal; time and counter control means coupled with said counter and with said timing signal means and operative to hold each but the lowest order of said counter in a given condition until said lowest order assumes a predetermined count in response to input signals from said oscillator, and to initiate operation of said timing signal means and of the other stages of said counter when said lowest order assumes said predetermined count; and oscillator control means coupled with said co-incidence detection means, with said timing means, and with said oscillator for adjusting the frequency of said oscillator in response to said timing signal and said first signal occurring at different times, said adjustment being in a direction to reduce the time difference between occurrence of said first and timing signals.

2. Apparatus as defined in claim 1 wherein the lowest order stage of said counter includes input signal division means and division control means for selecting the number of counts received by said lowest order stage before a transfer signal is applied to the adjacent higher order stage, and division means connecting one of the settable members of said frequency selection means associated with a counting stage higher than said lowest order stage with said division control means to cause adjustment of said division control means in response to setting of said one settable member.

3. The apparatus of claim 2 including timing signal adjustment means coupled with said one settable member for adjusting the time of occurrence of said timing signal in response to setting of said one settable member.

4. The apparatus of claim 2 wherein said division means is selectively operable to divide input signals applied to said lowest order counting stage by factors of two, five, or ten.

5. The apparatus of claim 2 wherein the settable member associated with the highest order stage of said counter is said one member and is settable only to positions of one through ten.

6. The apparatus of claim 5 wherein said division means is set to divide by two, five, and ten when said one settable member is respectively in its five-ten, two-four, and one positions.

7. The apparatus of claim 2 including signal output means coupled with said oscillator and having a plurality of decade related frequency division stages, and decimal switch means connected to said division stages.

8. The apparatus of claim 1 wherein said oscillator control means and said time and counter control means includes a first bistable circuit connected to said counter and settable to a first condition in response to said first signal, a second bistable circuit connected to said timing means and settable to a first condition in response to said timing signal, and circuit means coupled with the lowest order of said counter for placing each of said bistable circuits in their second conditions when the lowest order counter stage provides a count signal to an adjacent higher order at a time when both of said bistable circuits are in their said first conditions; a frequency increase circuit and a frequency decrease circuit connected between said oscillator and said bistable circuits and including signal gating means rendering said frequency decrease circuit operative when said first bistable circuit is in its first condition and said second bistable circuit is in its second condition and rendering said frequency increase circuit operative when said first bistable circuit is in its second condition and said second bistable circuit is in its first condition.

9. Apparatus as defined in claim 8 wherein said frequency increase and frequency decrease circuits include an integrator and current sources of opposite polarity respectively connected with the integrator circuit, and current control circuit means connected between said current sources and said signal gating means for permitting the application of current to said integrator from one or the other of said sources only when one of said bistable circuits is in its second condition and the other is in its first condition.

10. The apparatus of claim 9 wherein said current control circuit means includes a first transistor having a load current carrying electrode connected through a first diode to said first current source and a second transistor having a load current carrying electrode connected through a second diode to said second current source, and a rate circuit including a resistor and a capacitor connected to said integrator and to each of said transistors.

References Cited

UNITED STATES PATENTS

| | | | |
|---|---|---|---|
| 3,259,851 | 7/1966 | Brauer | 331—14 |
| 3,370,252 | 2/1968 | Zoerner | 331—18 |
| 3,375,461 | 3/1968 | Ribour et al. | 331—18 |

ROY LAKE, Primary Examiner

S. H. GRIMM, Assistant Examiner

U.S. Cl. X.R.

331—1, 17, 18, 25, 74